(12) United States Patent
Ma

(10) Patent No.: US 7,510,403 B2
(45) Date of Patent: Mar. 31, 2009

(54) ELECTRICAL CONNECTOR

(75) Inventor: Hao-Yun Ma, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/899,707

(22) Filed: Sep. 7, 2007

(65) Prior Publication Data

US 2008/0064246 A1    Mar. 13, 2008

(30) Foreign Application Priority Data

Sep. 8, 2006    (CN) .......................... 200620076442

(51) Int. Cl.
*H01R 12/00* (2006.01)
(52) U.S. Cl. ....................................................... 439/73
(58) Field of Classification Search ................... 439/73, 439/330, 331
See application file for complete search history.

(56) References Cited

U.S. PATENT DOCUMENTS

| | | | | |
|---|---|---|---|---|
| 6,685,494 B1 * | 2/2004 | McHugh et al. | ............. | 439/342 |
| 6,716,050 B1 * | 4/2004 | Ma et al. | ..................... | 439/331 |
| 6,832,919 B2 * | 12/2004 | Ma et al. | ...................... | 439/73 |
| 6,916,195 B2 | 7/2005 | Byquist | | |
| 6,948,947 B2 * | 9/2005 | Lee et al. | ...................... | 439/73 |
| 7,001,197 B2 | 2/2006 | Shirai et al. | | |
| 7,125,259 B2 * | 10/2006 | Hashimoto | .................... | 439/73 |
| 7,241,161 B2 | 7/2007 | Mar | | |
| 7,278,860 B2 * | 10/2007 | Ma | .............................. | 439/73 |
| 7,291,022 B2 * | 11/2007 | Toda et al. | ..................... | 439/73 |
| 7,387,523 B2 * | 6/2008 | Hsu | ........................... | 439/331 |
| 2004/0110396 A1 * | 6/2004 | Ma | .............................. | 439/73 |
| 2005/0014400 A1 * | 1/2005 | Liao et al. | ..................... | 439/73 |
| 2005/0124188 A1 * | 6/2005 | Ma | .............................. | 439/73 |
| 2005/0153581 A1 * | 7/2005 | Ma et al. | ........................ | 439/73 |
| 2005/0287858 A1 * | 12/2005 | Toda et al. | ................... | 439/331 |
| 2006/0040524 A1 * | 2/2006 | Liao et al. | ..................... | 439/73 |
| 2006/0116007 A1 * | 6/2006 | Ma | .............................. | 439/73 |
| 2006/0178021 A1 * | 8/2006 | McHugh et al. | ............... | 439/73 |
| 2007/0155215 A1 * | 7/2007 | Hsu | ........................... | 439/331 |
| 2007/0173081 A1 * | 7/2007 | Yu et al. | ........................ | 439/73 |

* cited by examiner

*Primary Examiner*—Ross N Gushi
(74) *Attorney, Agent, or Firm*—Wei Te Chung

(57) ABSTRACT

An electrical connector (1) for electrically connecting a chip module to a printed circuit board includes an insulative housing (2), a number of contacts received in the insulative housing, and a metal stiffener (3) partially surrounding the insulative housing. The insulative housing has an upper mounting surface, opposite lower connecting surface, and defines a number of contact-receiving passageways penetrating through said mounting and connecting surfaces thereof. The contacts are received in the contact-receiving passageways of the insulative housing adapted for electrically connecting with said chip module and the printed circuit board which respectively assembled to the mounting surface and the connecting surface of the insulative housing. The insulative housing has a portion located below the metal stiffener and confronted by the metal stiffener to prevent the deformation of the insulative housing.

14 Claims, 4 Drawing Sheets

ELECTRICAL CONNECTOR

BACKGROUND OF THE INVENTION

1. Field of the Invention

The present invention generally relates to an electrical connector, and more particularly to an electrical connector for removably mounting a chip module to a printed circuit board.

2. Description of Related Art

Connectors for mounting a chip module, such as a Central Processing Unit (CPU), to a printed circuit board are widely used in electrical equipments. Such a connector usually includes a base, a plurality of contacts retained in the base, a fastening frame partially surrounding the housing, a metal clip and an operational lever attached to the fastening frame. The base has a mounting surface to which the chip module is mounted and a connecting surface attached to the printed circuit board. When mounting, the connector is mounted to the printed circuit board, then the chip module is assembled to the mounting surface of the base and the metal clip is rotatably to partially cover the chip module, finally rotating the operational lever to a close position for retaining the chip module to the base. The contacts retained in the base realize the electrical connection between the chip module and the printed circuit board.

However, the connector with above structures has at least the shortcomings as follows: After securing the metal clip to the chip module, an upward force produced by the stiffener is exerted to the base since the base is put on the stiffener, and the clip and the lever are respectively pivotally retained to opposite ends of the stiffener. Particularly, the upward force becomes small gradually as away from opposite ends of the stiffener. Therefore, opposite ends of the base may become curved and thus, causing bottom surface of the base concave and influencing electrical connection between the electrical chip and the printed circuit board.

Therefore, it is desired to provide an improved electrical connector to stress the problems mentioned above. It is noted that U.S. Pat. No. 7,179,092 discloses one solution while such solution is somewhat passive from the technical viewpoint.

BRIEF SUMMARY OF THE INVENTION

Accordingly, an object of the present invention is to provide an electrical connector with improved structure for preventing the deformation of opposite ends of a base thereof.

In order to achieve the above-mentioned object, an electrical connector for electrically connecting a chip module to a printed circuit board comprises an insulative housing, a plurality of contacts received in the insulative housing, and a metal stiffener partially surrounding the insulative housing. The insulative housing has an upper mounting surface, opposite lower connecting surface, and defines a plurality of contact-receiving passageways penetrating through said mounting and connecting surfaces thereof. The contacts are received in the contact-receiving passageways of the insulative housing adapted for electrically connecting with said chip module and the printed circuit board which respectively assembled to the mounting surface and the connecting surface of the insulative housing. The insulative housing has a portion located below the metal stiffener and compressed by the metal stiffener to prevent the deformation of the insulative housing.

Other objects, advantages and novel features of the invention will become more apparent from the following detailed description of the present embodiment when taken in conjunction with the accompanying drawings.

DETAILED DESCRIPTION OF THE INVENTION

Figure 1:
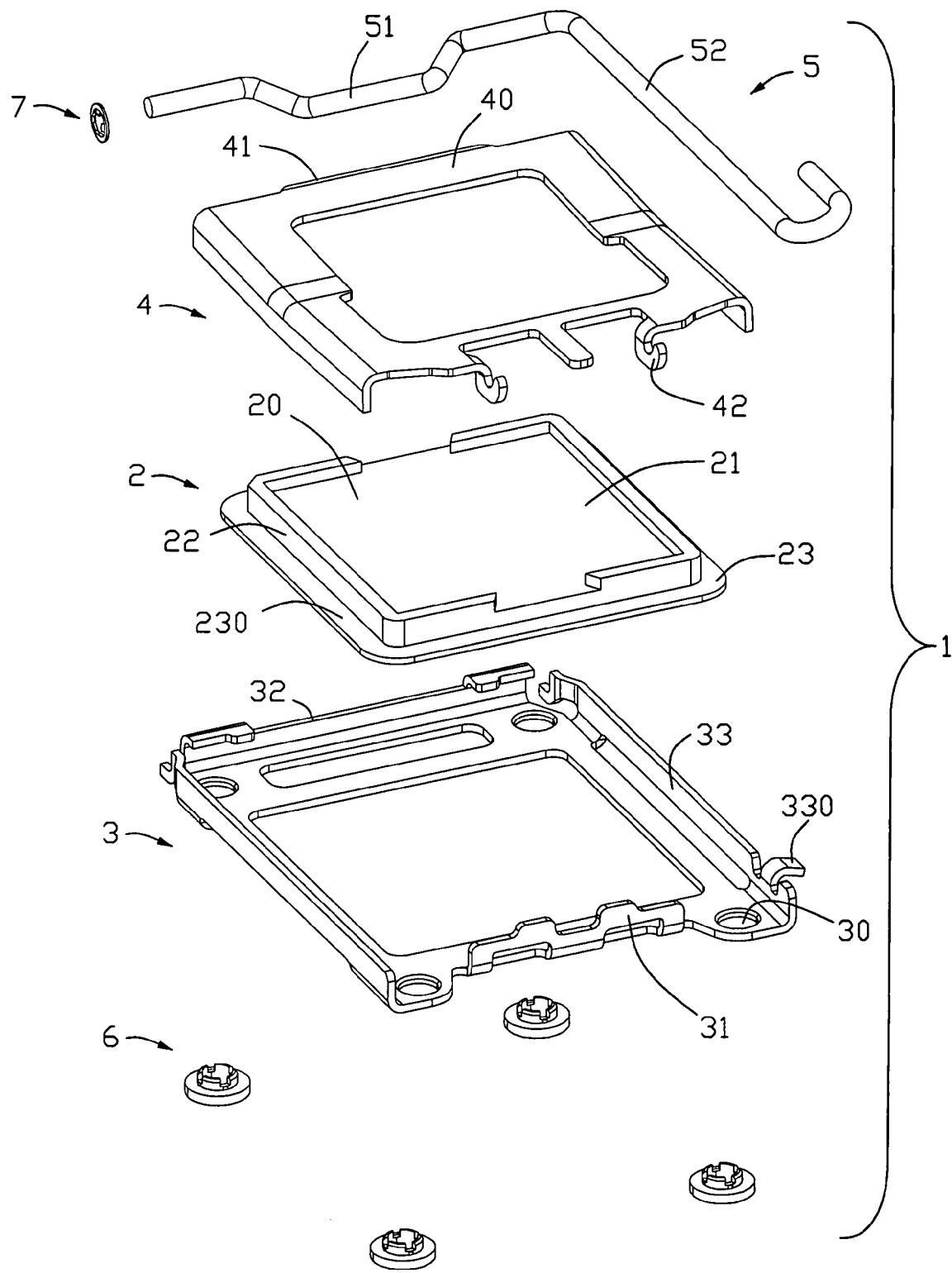
FIG. 1 is an exploded, perspective view of an electrical connector in accordance with the present invention.
Figure 2:
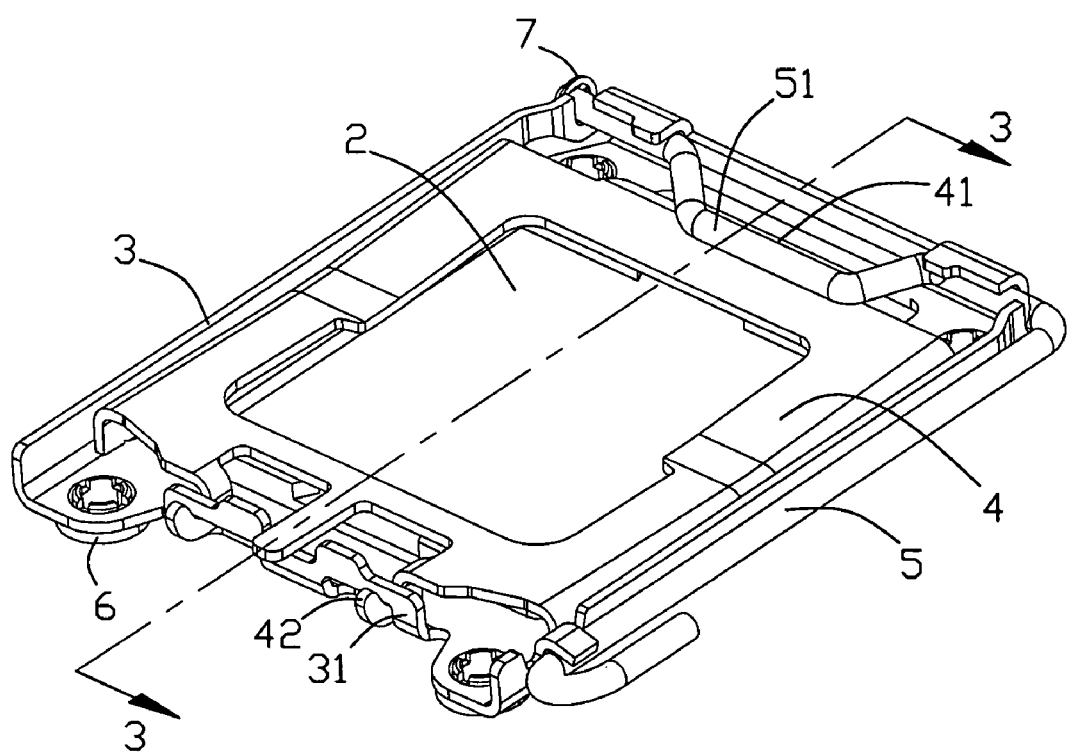
FIG. 2 is an assembled, perspective view of the electrical connector in FIG. 1.
Figure 3:
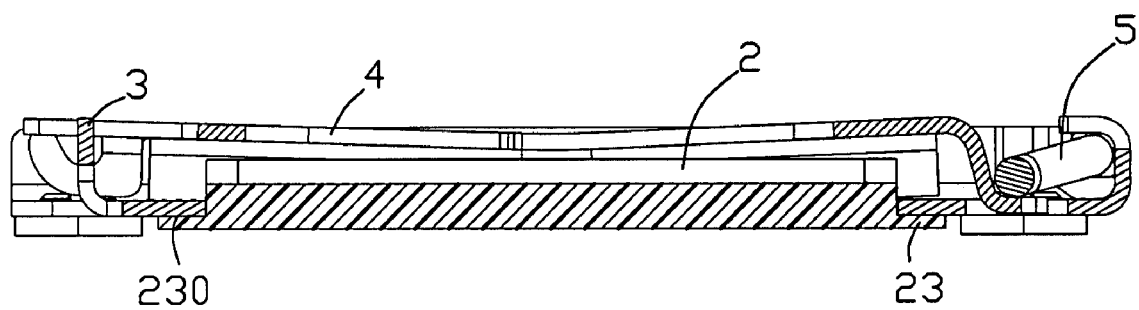
FIG. 3 is a cross-section view taken along line 3-3 of FIG. 2.
Figure 4:
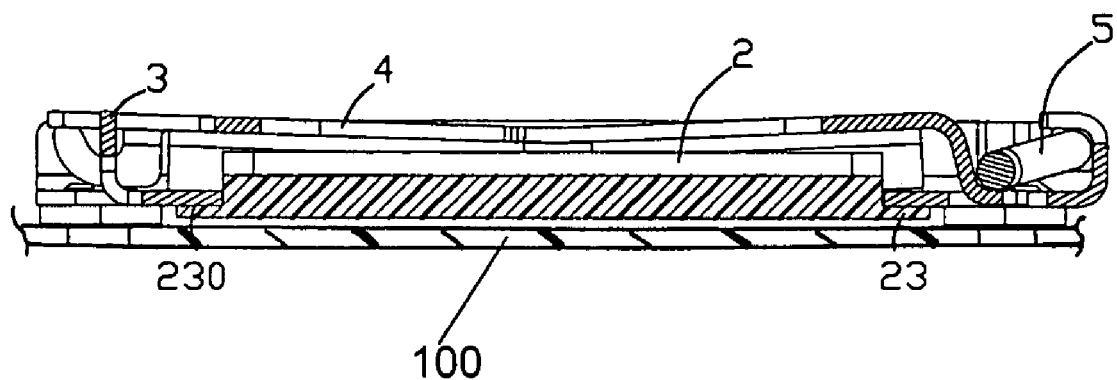
FIG. 4 is the connector shown in FIG. 3 seated upon an associated printed circuit board.

Reference will now be made to the drawing figures to describe the present invention in detail. Please refer to FIGS. 1-3, an electrical connector 1 in accordance with the present invention is a Land Grid Array (LGA) type electrical connector for electrically connecting a chip module, such as a Central Processing Unit (CPU), to a printed circuit board 100. The electrical connector 1 comprises an insulative housing 2, a plurality of contacts (not shown) housed in the insulative housing 2 each equipped with a solder ball (not shown) to mount to the printed circuit board 100, a metal stiffener 3 partially surrounding the insulative housing 2, a metal clip 4 pivotally assembled to one end of the metal stiffener 3, and a lever 5 pivotally assembled to the other end opposite to above one end of the metal stiffener 3.

The insulative housing 2 is substantially of rectangular shape and comprises a body portion 21, an upwardly-extending continuous surrounding wall 22 and a continuous extension portion 23 horizontally and outwardly extending from bottom edge of the surrounding wall 22. The insulative housing 2 comprises opposite upper and lower surfaces served as mounting surface and connecting surface (not labeled) to which the chip module and the printed circuit board are mounted. The body portion 21 defines a plurality of contact-receiving passageways (not shown) for receiving the contacts. The continuous surrounding wall 22 defines a receiving space 20 together with the body portion 21 for receiving the chip module. The surrounding wall 22 interferentially engages with the metal stiffener 3 to realize the stable connection between the stiffener 3 and the insulative housing 2. The metal stiffener 3 presses on an upper surface 230 of the extension portion 23 to restrict the upward movement of the insulative housing 2.

Upper and opposite lower ends of each contact are of elastic compressing structure for respectively connecting to the chip module and the printed circuit board.

The metal stiffener 3 is a flat board and defines a window (not labeled) in the center thereof for receiving the insulative housing 2. Two opposite edges of the metal stiffener 3 respectively upward extend to form a mounting portion 31 for pivotally mounting the metal clip 4 and a receiving portion 32 for pivotally receiving the lever 5. The other two opposite edges of the metal stiffener 3 forms two sidewalls 33 facing to each other with one sidewall 33 formed with a stop portion 330 for restricting the lever 5. Four positioning holes 30 are respectively defined in four corners of the metal stiffener 3 with positioning blocks 6 received therein to retainably position the electrical connector 1 to the printed circuit board corporately with positioning means like screws (not shown).

The lever 5 is substantially L-shape and comprises an operating portion 51 for pressing the metal clip 4 and an engaging portion 52 engaging with the metal stiffener 3. A restricting ring 7 is positioned on one end of the lever 5 for restricting the rotation of the lever 5 and the other end of the lever 5 is of U-shape and capable of being restricted by the stop portion 330.

The metal clip 4 is of a substantially flat board and comprises a main portion 40 pivotally covering upper surface of the electrical chip. The main portion 40 comprises an engaging portion 41 extending arcuately from an end thereof and a pair of spaced hooks 42 formed at the opposite end thereof for pivotally retaining to the mounting portion 31. The operating portion 51 presses on the engaging portion 41 to reliably retain the chip module to the insulative housing 2.

When assembly, the base 2 is assembled to the metal stiffener 3. Now, the surrounding wall 23 of the insulative housing 2 protrudes through the window of the metal stiffener 3 with the upper surface 230 of the extension portion 23 of the insulative housing 2 abutting against bottom surface of the metal stiffener 3. The lever 5 is pivotally received in the receiving portion 32 of the metal stiffener 3 and the metal clip 4 is pivotally mounting to the mounting portion 31 of the stiffener 3. The electrical connector 1 is positioned to the printed circuit board via the positioning means mentioned above. Then the chip module is put into the receiving space 20 of insulative housing 2. The metal clip 4 is rotated until engaging with the stiffener 3. The lever 5 is rotated until restricted by the stop portion 330 of the stiffener 3, thus, realizing the electrical connection between the chip module and the printed circuit board. Since the metal stiffener 3 is located on the upper surface 230 of the extension portion 23 of the insulative housing 2, although opposite ends of the metal clip 4 retain the insulative housing 2 to the metal stiffener 3, the metal stiffener 3 does not exert two large force to opposite ends of the insulative housing 2. Therefore, the deformation of the opposite ends of the insulative housing 2 can be avoided which facilitates the reliable electrical connection between the chip module and the printed circuit board.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector adapted for electrically connecting a chip module to a printed circuit board, comprising:
   an insulative housing having an upper mounting surface, opposite lower connecting surface, and defining a plurality of contact-receiving passageways penetrating through said mounting and connecting surfaces thereof;
   a plurality of contacts received in the contact-receiving passageways of the insulative housing adapted for electrically connecting with said chip module and the printed circuit board which respectively assembled to the mounting surface and the connecting surface of the insulative housing; and
   a metal stiffener partially surrounding the insulative housing and comprising a flat board essentially downwardly directly and communicatively confronting the printed circuit board; and wherein
   the insulative housing has a portion located below the metal stiffener and compressed by the metal stiffener to prevent the deformation of the insulative housing.

2. The electrical connector as claimed in claim 1, wherein the insulative housing comprises a body portion, a continuous surrounding wall upwardly extending from the body portion, and an extension portion horizontally and outwardly extending from the surrounding wall, and wherein the extension portion of the insulative housing is located below the metal stiffener and compressed by the metal stiffener.

3. The electrical connector as claimed in claim 2, wherein the metal stiffener defines a window in the center thereof, and wherein the main portion and the surrounding wall protrude through the window with the extension portion blocked by the portions round the window of the metal stiffener.

4. The electrical connector as claimed in claim 1, further comprising a metal clip and a lever respectively pivotally mourned to opposite ends of the metal stiffener.

5. The electrical connector as claimed in claim 4, wherein the metal clip partially covers the insulative housing and has an engaging portion compressed by the lever when the lever in a closed position.

6. The electrical connector as claimed in claim 1, wherein the metal stiffener defines at least a pair of positioning holes in at least one pair of corners thereof, and a pair of positioning blocks are interferentially received in the at least a pair of positioning holes for retaining the metal stiffener to the printed circuit board.

7. The electrical connector as claimed in claim 1, wherein said stiffener further includes four edge walls extending upwardly from the flat board.

8. The electrical connector as claimed in claim 7, wherein said stiffener is dimensionally larger than the housing in a top view in both front-to-back and transverse directions so as to have the housing surrounded among said four edge walls.

9. An LGA (Land Grid Array) connector adapted for electrically connecting a chip module to a printed circuit board, comprising:
   an insulative housing defining a plurality of contact-receiving passageways along up-to-down direction;
   a plurality of contacts received in the contact-receiving passageways of the insulative housing;
   a metal stiffener partially surrounding the insulative housing defining a window to permit the protrusion of the insulative housing;
   a metal clip pivotally mounted to one end of the metal stiffener; and
   a lever pivotally mounted to opposite the other end of the metal stiffener; and wherein
   the insulative housing has an extension portion with dimension larger than that of the window and located below the metal stiffener to be compressed by the metal stiffener; and the metal stiffener defines four positioning holes at four corners thereof, and wherein four positioning blocks are interferentially received in the positioning holes to position the electrical connector to the printed circuit board.

10. The LGA connector as claimed in claim 9, wherein the insulative housing comprises a main portion, a surrounding wall extending upwardly from the main portion and said extension portion extending horizontally and outwardly from the surrounding wall.

11. The LGA connector as claimed in claim 9, wherein each contact has upper and lower ends exposed beyond upper and lower surfaces of the insulative housing and both being compression structure.

12. An LGA (Land Grid Array) connector assembly comprising:
   a printed circuit board;
   an insulative housing located above the printed circuit board and provided with a plurality of contacts therein and defining a receiving space in an upper face, said housing defining a flange round a bottom face;

a metallic stiffener essentially located above the flange and defining an opening to enclose said housing;
a metallic clip pivotally mounted on one end of the stiffener; and
lever pivotally mounted on1the other end of the stiffener; wherein
a plurality of positioning blocks supportably sandwiched between the stiffener and the printed circuit board.

13. The LGA connector assembly as claimed in claim 12, wherein the said flange results in a downward assembling of the stiffener to the housing.

14. The LGA connector assembly as claimed in claim 12, wherein the stiffener is assembled to the printed circuit board around the positioning blocks instead of through the housing.

* * * * *